United States Patent [19]

Rostoker et al.

[11] Patent Number: 5,405,808

[45] Date of Patent: Apr. 11, 1995

[54] FLUID-FILLED AND GAS-FILLED SEMICONDUCTOR PACKAGES

[75] Inventors: Michael D. Rostoker, San Jose; Nicholas F. Pasch, Pacifica; Mark Schneider, San Jose, all of Calif.

[73] Assignee: LSI Logic Corporation, Milpitas, Calif.

[21] Appl. No.: 142,674

[22] Filed: Oct. 26, 1993

Related U.S. Application Data

[62] Division of Ser. No. 108,199, Aug. 16, 1993.

[51] Int. Cl.$^6$ .......................................... H01L 21/60
[52] U.S. Cl. .................... 437/209; 437/214; 437/215; 437/216; 437/219
[58] Field of Search ............... 437/209, 214, 215, 216, 437/219; 257/704, 765

[56] References Cited

U.S. PATENT DOCUMENTS

| | | | |
|---|---|---|---|
| 3,411,049 | 3/1966 | Trincossi et al. | 317/234 |
| 3,739,234 | 6/1973 | Bylund et al. | 317/234 R |
| 3,792,318 | 2/1974 | Fries et al. | 317/234 R |
| 3,852,806 | 12/1974 | Corman et al. | 357/82 |
| 3,980,133 | 9/1976 | Mitsuoka et al. | 165/105 |
| 3,986,550 | 10/1976 | Mitsuoka | 165/105 |
| 4,047,198 | 9/1977 | Sekhon et al. | 357/82 |
| 4,092,697 | 5/1978 | Spaight | 361/386 |
| 4,145,708 | 3/1979 | Ferro et al. | 357/82 |
| 4,323,914 | 4/1982 | Berndimaier et al. | 357/82 |
| 4,619,316 | 10/1986 | Nakayama et al. | 165/104.33 |
| 4,730,665 | 3/1988 | Cutchaw | 165/80.4 |
| 4,912,548 | 3/1990 | Shanker et al. | 357/82 |
| 4,961,106 | 10/1990 | Butt et al. | 357/74 |
| 5,019,892 | 5/1991 | Grabbe | 357/74 |
| 5,031,072 | 7/1991 | Malhi et al. | 361/387 |
| 5,095,404 | 3/1992 | Chao | 361/385 |
| 5,130,889 | 7/1992 | Hambergen et al. | 361/388 |
| 5,161,090 | 11/1992 | Crawford et al. | 361/385 |
| 5,209,803 | 5/1993 | Powell | 156/345 |
| 5,243,756 | 9/1993 | Hamburgen et al. | 437/219 |

FOREIGN PATENT DOCUMENTS

2105729A 3/1983 United Kingdom .

OTHER PUBLICATIONS

"Low Temperature and Atmospheric Pressure CVD Using Polysiloxane, OMCTS, and Ozone", by Fujino et al., J. Electrochem. Soc., vol. 138, No. 12, Dec. 1991, pp. 3727–3732.

"Excimer Laser CVD of Silicon Oxide on GaAs: A Comparison With Desposition On c–Si", by Gonzalez et al., Applied Surface Science, vol. 54. pp. 108–111, Jan. 1992.

"Deposition of Sio/sub 2/ films from ArF Laser Photolysis of SiH/sub 4//N/sub 2/0 Mixtures", by Tsuji et al. Japanese Journal of Applied Physics, vol. 30, Issue 11A, pp. 2868–2872, Nov. 1991.

Primary Examiner—Brian E. Hearn
Assistant Examiner—Kevin M. Picardat
Attorney, Agent, or Firm—Honigman Miller Schwartz and Cohn

[57] ABSTRACT

Improved thermal and/or electrostatic discharge characteristics are realized in cavity-type semiconductor device assemblies by filling the cavity with either a thermally conductive fluid and/or an arc suppressing gas, or combinations thereof. The interior of the cavity, including the die, leads extending into the cavity, and connections between the die and the leads may be coated to provide protection from corrosive and/or electrical characteristics of the cavity-filling fluid (liquid or gas). The fluid may be introduced through a hole in a lid sealing the cavity, and the cavity is filled sufficiently that the fluid is in contact with the die at various spatial orientations of the package. A thermally-conductive fluid substantially filling the cavity provides improved thermal conduction from the die to the package body without the mechanical stress problems (e.g., thermally induced cracking) ordinarily associated with bonding solid materials to the die. An arc-suppressing gas filling the cavity provides significant suppression of electrical discharges, thereby producing a packaged semiconductor device with improved electrostatic characteristics.

11 Claims, 3 Drawing Sheets

FLUID-FILLED AND GAS-FILLED SEMICONDUCTOR PACKAGES

This application is a division of application Ser. No. 08/108,199, filed Aug. 16, 1993, (pending).

Technical Field of the Invention

The invention relates to semiconductor device assemblies, and more particularly to techniques for dissipating heat from packaged integrated circuit (IC) dies.

BACKGROUND OF THE INVENTION

As used herein, a "semiconductor device" is a silicon chip (die) containing circuit elements. A "semiconductor device assembly" or "semiconductor device package" is a silicon chip contained within a package and connected (wired or bonded) to conductive leads which exit the package.

Heat is inevitably generated during operation of a semiconductor device, and may become destructive of the device if left unabated. The problem of heat dissipation is especially relevant in semiconductor devices that have a high lead count (e.g., high I/O) or which operate at high speeds, both of which factors contribute significantly to the generation of heat by the device.

It is generally well known to provide some sort of heat sink for semiconductor devices. Heat sinks generally include at least a heat-transferring portion positioned in close proximity to the semiconductor device (die) for efficiently extracting heat therefrom, and a heat-dissipating portion remote from the die with a large surface area for dissipating heat. The heat-dissipating portion is typically formed with a number of parallel fin layers, through which air passes to remove heat from the heat sink.

In many semiconductor device packages, notably ceramic packages, M-QUAD packages, and other "lidded" packages, the semiconductor die (device) is disposed in a cavity of the package. (Such packages are referred to hereinafter as "cavity-type" semiconductor device packages.) Heat dissipation is usually accomplished in such packages through conduction of heat via a die mounting surface of the package, such as the bottom of the cavity. A significant portion of the surface area, of the die, however, is not in direct contact with the die mounting surface of the package. Therefore, no significant amount of heat is removed from the die via these "unmounted" surfaces. While some attempts have been made to conduct heat from more than one surface of a semiconductor die, these approaches are often expensive or impractical due to mechanical and/or manufacturing difficulties such as thermally induced distortions of the die and/or heat sink, differential coefficients of expansion between the die and the heat conducting material to which it is connected, damage to delicate bond wires, critical tolerances, physical size and configuration of the heat conducting device, etc.

Approaches to "heat-sinking" which involve either direct contact or an adhesive bond between a heat-generating semiconductor die and a heat-sink structure (e.g., a metal heat-dissipating structure bonded to the die) can be particularly troublesome. The semiconductor die generally expands (thermally) at a different rate than the heat sink structure. At elevated temperatures (or at temperatures significantly different from the temperature at which the heat sink was bonded to the die), such differential rates of expansion can cause mechanical stresses which can result in the die (which is relatively brittle) cracking, resulting in complete device failure.

At least one rationale for metal (or solid) heat sinks in direct or close thermal contact with the semiconductor die involves the observation that removal of heat from the die by the heat sink limits the absolute temperature rise of the die, thereby simultaneously limiting the degree of differential thermal expansion between the die and the heat sink. Unfortunately, however, in order to take advantage of this characteristic, it is necessary to limit the range of ambient temperatures over which the die can operate. Such differential rates of thermal expansion can also have an adverse impact on the range of storage temperatures which a semiconductor device package can endure.

As semiconductor device speeds and I/O (Input/Output) densities increase, the issue of heat dissipation from semiconductor devices becomes considerably more critical.

In addition to heat conduction problems, many modern integrated circuit components, particularly MOS and CMOS components, are susceptible to damage from high voltage discharge due to electrostatic events (e.g., static electricity discharge). Many modern air-filled packages (i.e., the package cavity is filled with air) contain carbonaceous (carbon containing) gases after sealing. An electrostatic discharge within the cavity of the package can cause a permanent carbon "track" to be formed along the path of the discharge. This "track" can cause current leakage and can render the packaged component inoperable. As a result, such integrated circuit components often require special handling and assembly procedures to minimize the probability of electrostatic discharge prior to assembly. Further, when such components are used in "harsh" electrostatic environments, special protection circuitry must often be provided external to the package.

DISCLOSURE OF THE INVENTION

It is therefore an object of the present invention to provide a improved technique for dissipating heat from a semiconductor die in a cavity-type semiconductor device package.

It is another object of the invention to provide an improved technique for conducting heat from more than one surface of a semiconductor die in a cavity-type semiconductor device package.

It is another object of the invention to accomplish the foregoing objects while minimizing the potential for damage to the die or its electrical connections.

It is another object of the invention to accomplish the foregoing objects inexpensively.

It is another object of the invention to provide a technique for improving the electrostatic characteristics of semiconductor devices in cavity-type packages.

It is another object of the invention to provide a technique for suppressing electrostatic discharges inside cavity-type semiconductor device packages.

According to the invention, a semiconductor die is disposed in the cavity of a cavity-type semiconductor device package, and is connected to inner ends of conductive leads which are exposed within the cavity. The die, the exposed portions of the conductive leads and the connections between the die and the leads are covered with an inorganic dielectric coating, such as silicon dioxide, thereby "hermetically" sealing the die and leads from their surroundings in the cavity. The cavity, (which contains the die) is filled with a thermally conductive fluid and is sealed with a lid. A sufficient amount of the thermally conductive fluid is used so that once sealed, a substantial portion of the die remains covered by the fluid regardless of the orientation of the package.

According to an aspect of the invention, the lid may be provided with one or more holes. The holes can be used to completely fill the cavity after covering it with the lid. When the cavity is completely filled, the holes are sealed with a suitable plug or sealant.

In operation, heat generated in the die is carried away from the die by conduction, not only through the die mounting, but also through the thermally conductive liquid. Hence, heat can be conducted away from both sides of the die. Virtually any liquid (even water) has much higher thermal conductivity than a gaseous surrounding and serves to further thermally connect the die to the outside of the package. This provides significantly lower thermal resistance between the die and the package than would be possible without the liquid.

The use of the inorganic dielectric coating around the die and conductive leads serves to protect the die from any adverse effects of direct contact with the conductive fluid, and permits selection of the thermally conductive fluid from a much wider range of choices than would be available without the coating. Since the die, connections and conductive leads are protected, liquids can be used which are highly thermally conductive, but which would otherwise attack metal on the die or the metal of the connections or conductive leads. Liquids which are electrically conductive, or which contain suspended conductive particles, can also be used.

The thermally conductive liquid may be any suitable fluid such as fluorocarbon, silicone oil, helium, hydrogen, or silicate "gel". The cavity can be filled with the liquid before sealing the cavity with a lid, or alternatively, the lid can be provided with one or more filling holes through which the liquid can be introduced into the cavity. In the event that filling holes are provided in the lid, they are sealed after introduction of the liquid into the cavity.

Further, according to the invention, gaseous sulfur hexafluoride ($SF_6$) can be used to great advantage in filling a cavity of a semiconductor device assembly, because of its unique ability to suppress electric arc discharges. Sulfur Hexafluoride is known and used widely in electrical power distribution systems for the purpose of suppressing arcs in high power electrical equipment.

According to the invention, if a cavity-type package is filled with sulfur hexafluoride, significant suppression of electrostatic discharges results.

According to an aspect of the invention, the cavity of a semiconductor device can be filled with gaseous sulfur hexafluoride by assembling and closing the cavity in a pressurized-sulfur hexafluoride gaseous environment.

Alternatively, according to the invention, a lid for the cavity can be provided with one or more holes through which the cavity can be filled with sulfur hexafluoride, after which the holes can be sealed.

Other objects, features and advantages of the invention will become evident in light of the following description thereof.

DETAILED DESCRIPTION OF THE INVENTION

Figure 1A:
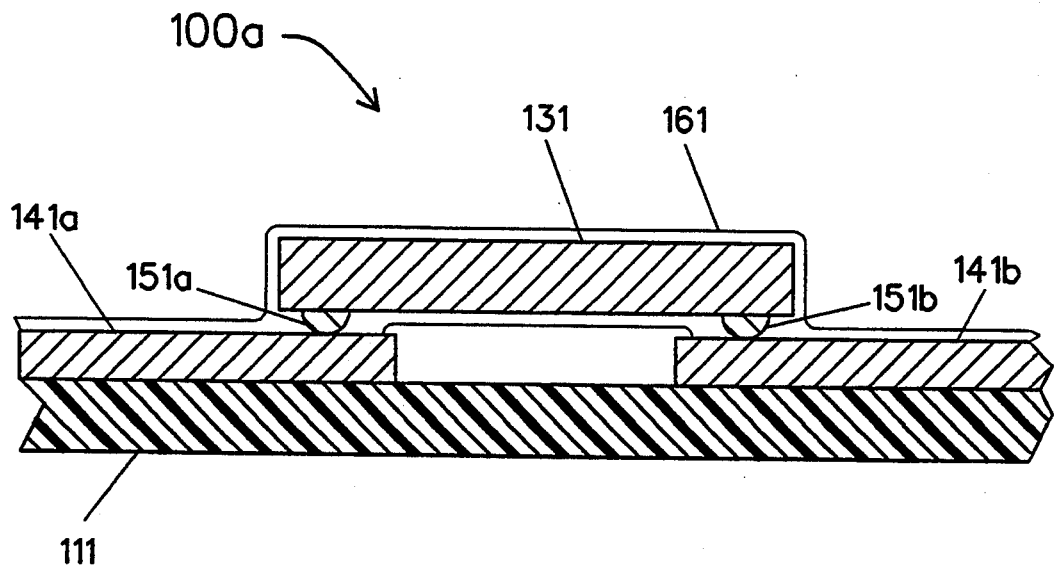
FIG. 1a is a cross-sectional view of a portion of a semiconductor device assembly incorporating an overcoated semiconductor die.

According to the invention, generally, a semiconductor die is disposed in a cavity-type semiconductor device package, electrical connections are formed between conductive leads of the package and the die, and exposed portions of the die, conductive leads and the electrical connections are covered with an inorganic dielectric coating, such as silicon dioxide, thereby "hermetically" sealing the die from its surroundings in the cavity. The cavity (which contains the die) is filled with a thermally conductive fluid and is sealed with a lid. A sufficient amount of the thermally conductive fluid is used that once sealed, a substantial portion of the die remains covered by the fluid regardless of the orientation of the package.

According to an aspect of the invention, the lid may be provided with one or more holes. The holes can be used to completely fill the cavity after covering it with the lid. When the cavity is sufficiently (preferably completely) filled, the holes are sealed with a suitable plug or sealant.

In operation, heat generated in the die is carried away from the die by conduction not only through the die mounting, but also through the thermally conductive fluid.

The use of the inorganic dielectric coating around the die and conductive leads serves to protect the die from any adverse effects (e.g., electrical, corrosive) of direct contact with the conductive fluid, and permits selection of the thermally conductive fluid from a much wider range of choices than would be available without the coating. Since the die, connections and conductive leads are protected, liquids can be used which are highly thermally conductive, but which would otherwise attack metal on the die or the metal of the connections or conductive leads.

U.K. Patent number GB 2105729, describes a pulsed plasma process for depositing inorganic coatings suitable for use in the various embodiments of the present invention. This process is based on the concept that if full dissociation of precursor gases is achieved in the gaseous phase, then deposition of high-quality layers of inorganic films at room temperature is possible. At pulsed power densities (RF or microwave) of 100 to 300 $W/cm^3$, deposition rates in excess of 0.3 $\mu m/min$. of high-quality, low-stress inorganic films are possible, even without substrate bias. Pulse repetition rates and gas exchange rates are matched and adjusted to give a low average power and full reactant replenishment (complete exchange of gases) with each pulse. Since the reactants may be changed for each pulse, the process lends itself to multi-layer coatings with minimal loss in deposition rate.

Another process for depositing inorganic coatings suitable for use in the various embodiments of the present invention is microwave ECR (Electron Cyclotron Resonance) deposition. The microwave ECR process is a "downstream" process, i.e., a plasma containing the reactants is created in a separate chamber which is joined by a tube to a coating chamber containing the article to be coated. The reactive species are then transported by gas flow to the coating chamber where they are exposed to a cross flow of silane to produce the coating. The reactants are created in the plasma chamber, but survive at least long enough to react in the coating chamber. Plasma environments tend to be rather "chaotic" high-energy environments, and can have serious destructive effects on finished semiconductor devices. Because of the downstream nature of this process, which keeps the article to be coated (presumably a semiconductor device) away from the direct effects of the plasma environment, the damage to the article (e.g., to the die) is minimal. Other methods of depositing an inorganic, dielectric coating are also considered.

FIG. 1a is a cross-sectional view of a portion of a semiconductor device package 100a, showing a die 131 which is electrically connected and mounted to conductive leads 141a and 141b by conductive bump contacts 151a and 151b, respectively (only two contacts are shown in the cross-sectional view). The die 131, the bump contacts 151a and 151b, and the conductive leads 141a and 141b are completely overcoated with an inorganic, dielectric coating 161, such as silicon dioxide. In further processing steps (and in a broader view), according to the invention, the die would be sealed in a cavity of the package (not shown in FIG. 1a) which is filled with a thermally conductive fluid. Examples of suitable thermally conductive fluids are: fluorocarbon, silicone oil, liquid helium or hydrogen, silicone or silicate gel (such "gels" behave in a manner sufficiently similar to thermally conductive fluids for the purposes of the present invention).

The following descriptions of the inventive technique are directed to dies which are electrically connected via bond wires, but it will be readily understood by one of ordinary skill in the art that any electrical die connection technique can be readily accommodated by the present inventive technique, and that an encapsulating coating of an inorganic dielectric material (e.g., $SiO_2$) may be applied over any semiconductor die and its electrical connections by the techniques described hereinabove.

Figure 1B:
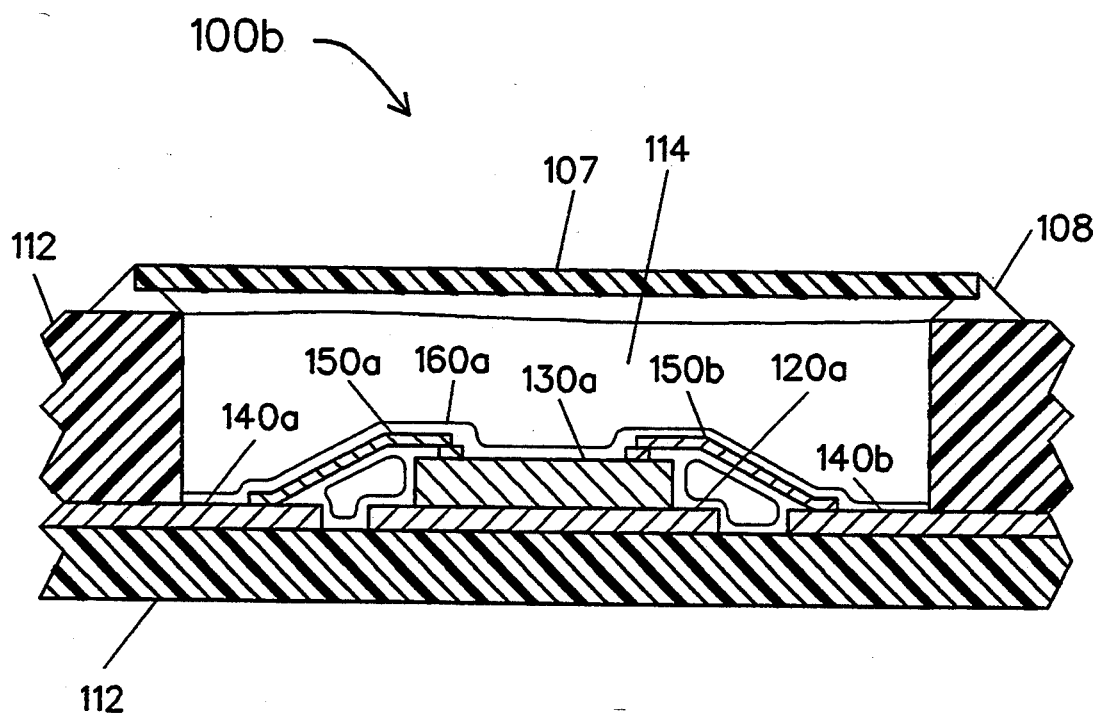
FIG. 1b is a cross-sectional view of a fluid-filled cavity-type semiconductor device assembly, according to the invention.

FIG. 1b is a cross-sectional view of a cavity-type semiconductor package assembly 100b, according to the present invention. A package body 112 includes a cavity wherein a semiconductor die 130a is mounted to a die attach pad 120a at the bottom of the cavity. (The die attach pad is an optional feature.) Conductive traces (or leads) 140a and 140b extend into the cavity. Many such leads would extend into the cavity area, generally in one-to-one correspondence with the number of bond pads on the die. A bond wire 150a forms an electrical connection between the die 130a and the one of the conductive traces 140a. Another bond wire 150b forms another electrical connection between the die 130a and another conductive trace 140b. An inorganic, dielectric coating 160a is disposed over the die 130a, the bond wires 150a and 150b, exposed portions of the die attach pad 120a, a portion of the bottom of the cavity, and exposed portions of the conductive traces 140a and 140b. The coating 160a is formed by a suitable deposition process, such as the aforementioned pulsed plasma, ECR or other coating process, such that the die 130a, bond wires 150a and 150c, and the conductive traces 140a and 140b are completely covered (sealed from the outside environment). After coating the die 130a, the cavity is filled with a suitable thermally conductive liquid 114, such as a fluorocarbon or silicone oil. A lid 107 is disposed over the cavity, completely covering it. The lid 107 is secured in place to seal the cavity with a suitable sealant or adhesive 108. A sufficient amount of fluid 114 is disposed in the cavity to ensure that a substantial portion of the exposed die surface (or more accurately, the coating over the die surface) is immersed in the liquid 114 regardless of the orientation of the package (e.g., even with the package placed on its side, such as in a plug-in computer board).

The package body 112 may be formed of any suitable packaging material such as plastic, ceramic, or a multi-layer printed circuit board material where an opening is formed in some of the layers to form the die-receiving recess (cavity).

Figure 1C:
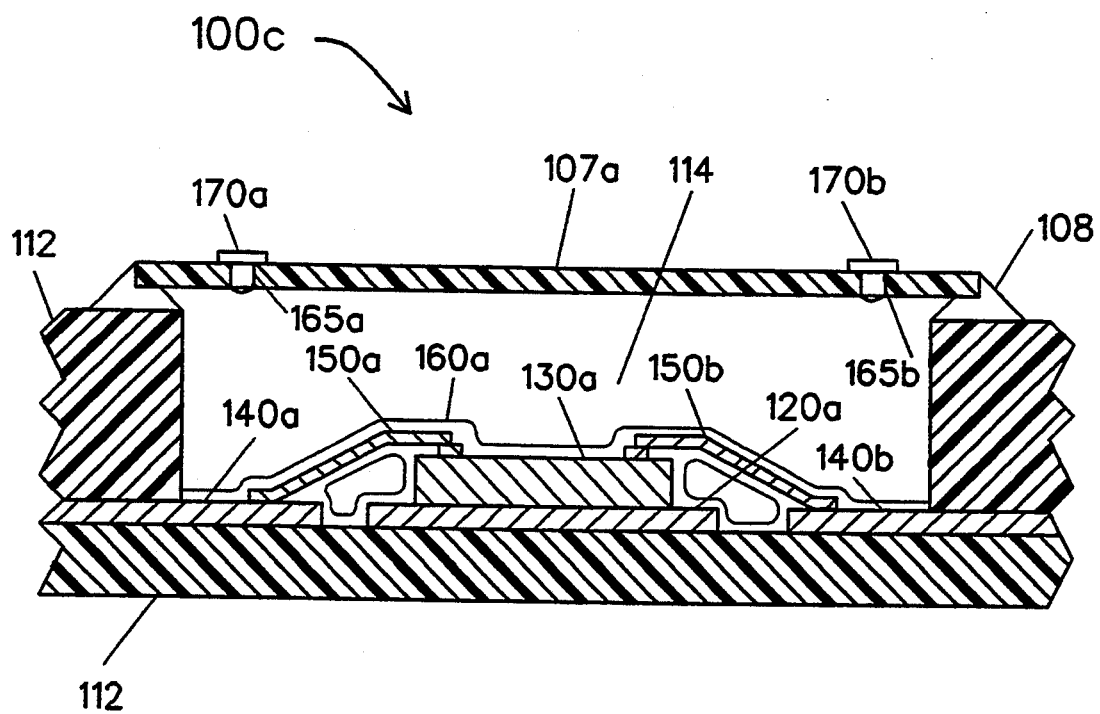
FIG. 1c is a cross-sectional view of a another embodiment of a fluid-filled cavity-type semiconductor package according to the invention.

FIG. 1c shows an alternative cavity-type semiconductor device assembly 100b, identical to FIG. 1b in all respects except that a lid 107a is provided with "vent" holes 165a and 165b (two shown, at least one must be used). The lid covers and seals the die within the cavity. In this case, the lid 107a is assembled to the package prior to filling the cavity with the thermally conductive fluid 114. The cavity is filled with the thermally conductive fluid 114 through one of the "vent" holes 165a or 165b. As the liquid 114 fills the cavity, the gaseous environment therein is displaced. If two holes (e.g., 165a,b) are used, the second hole may be used as an escape vent for the gas in the cavity. Fluid emanating from the second hole (i.e., the one not being used to fill the cavity) indicates that the cavity is full. Using this technique, it is possible to completely fill the cavity. After the cavity is full, the holes 165a and 165b are sealed with suitable plugs or sealant globs 170a and 170b, respectively.

While a number of specific embodiments are shown, these are merely exemplary of the many possible cavity-type packages which can be fabricated using this technique. It will be readily understood by one of ordinary skill in the art that other cavity-type packages, such as the "M-Quad" package (which is characterized by a plastic sealing and bonding ring between a pair of opposing lids, at least one of which has a "vent" hole to facilitate assembly) may be readily accommodated by the present inventive technique.

UK Patent Publication Number 2,105,729 has been referred to hereinabove as a suitable technique for applying the relatively water-impermeable coating to the die. Additional techniques of applying the relatively water-impermeable coating to the die are discussed in:

(1) *Low Temperature and Atmospheric Pressure CVD Using Polysiloxane, OMCTS, and Ozone*, Fujino, et al., J. Electrochem. Soc. Vol. 138, No. 12, December 1991, The Electrochemical Society;

(2) *Excimer Laser CVD of Silicon Oxide on GaAs: a comparison with deposition on c-Si*, Gonzalez, et al., Applied Surface Science, Vol. 54, pp. 108–111, January, 1992; and (3) *Deposition of SiO₂ films from ArF Laser Photolysis of SiH₄N₂ Mixtures*, Tsuji, et al., Japanese Journal of Applied Physics, Vol. 30, Issue 11A, pp. 2868-72, November, 1991.

These references are incorporated by reference herein as non-essential background material.

Figure 2A:
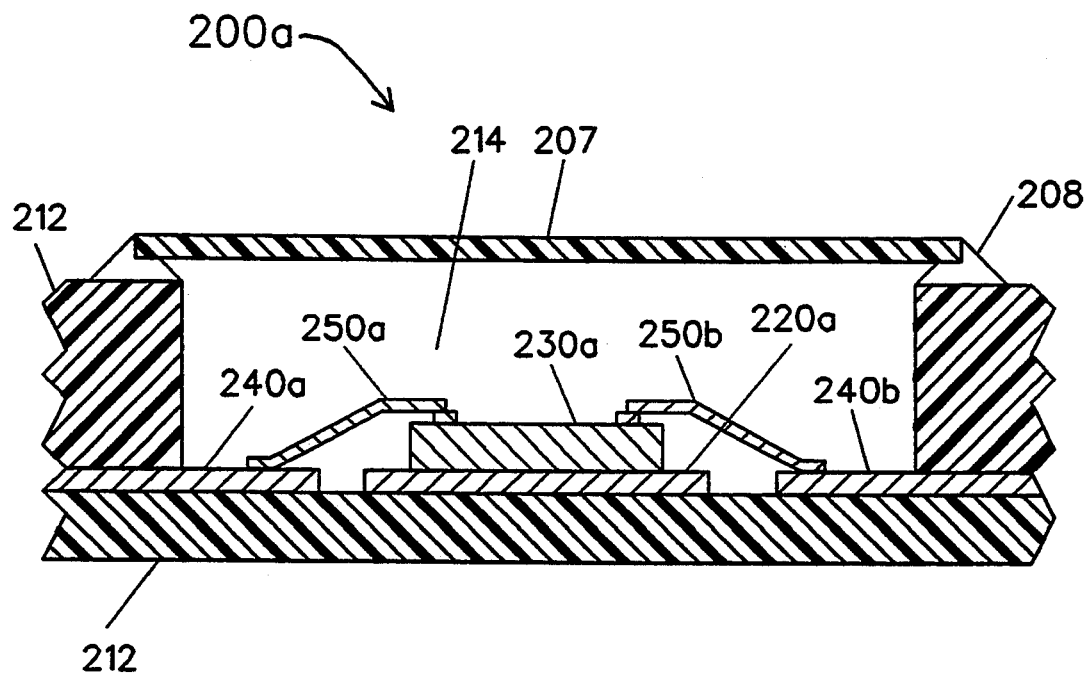
FIG. 2a is a cross-sectional view of a gas-filled cavity-type semiconductor device assembly, according to the invention.
Figure 2B:
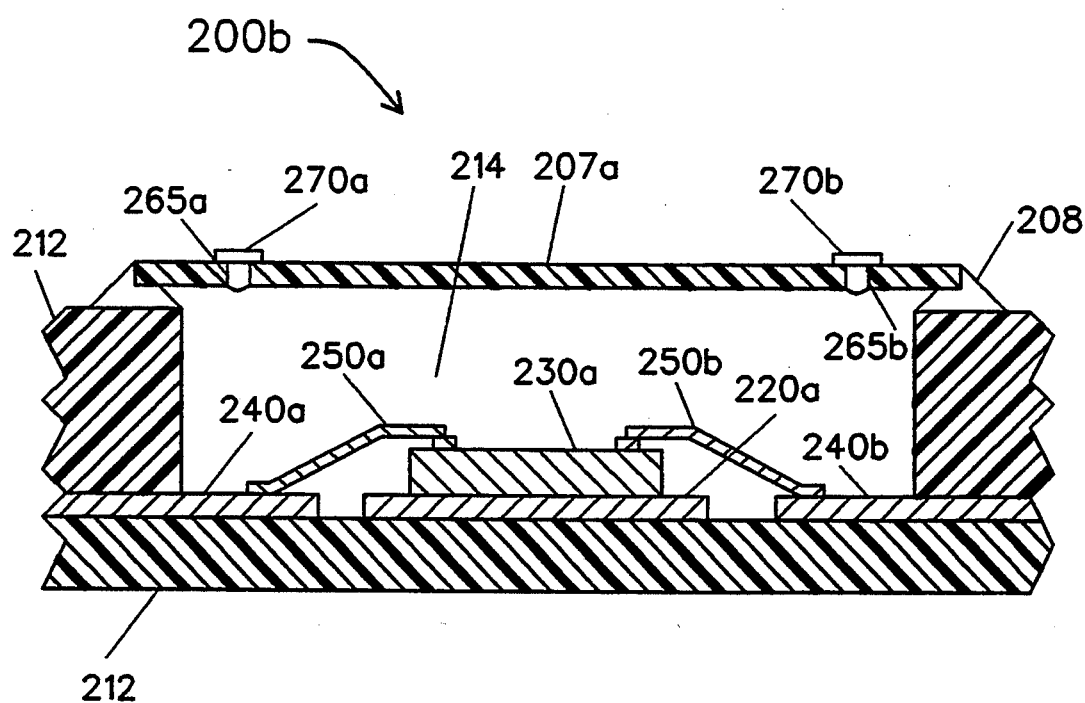
FIG. 2b is a cross-sectional view of another embodiment of a gas-filled cavity-type semiconductor device assembly, according to the invention.

Although the foregoing embodiments (FIGS. 1a-c) are directed to the use of liquids for filling the cavity, similar benefits can be obtained from filling a cavity of a semiconductor device assembly with a selected gas and sealing the cavity such that the gas in the cavity remains at a substantial partial pressure within the enclosed space of the cavity over the entire useful life of the semiconductor device. The following embodiments, discussed hereinbelow with respect to FIGS. 2a and 2b, are directed to semiconductor device assemblies of this type.

According to an embodiment of the invention, gaseous sulfur hexafluoride ($SF_6$) can be used to great advantage in filling a cavity of a semiconductor device assembly, because of its ability to suppress electric arc discharges.

Electrostatic discharge has received a great deal of attention in the electronics industry, particularly with respect to its effect on CMOS devices. A single electrostatic discharge of sufficient energy can completely destroy a semiconductor device. The electronics industry has responded primarily with improved handling techniques, assembly techniques, and protection circuitry, both on and off the semiconductor die.

According to the invention, if a cavity-type packages similar to those described hereinabove with respect to FIGS. 1b and 1c is filled with sulfur hexafluoride, significant suppression of electrostatic discharges will result. Hence, devices packaged according to the inventive technique will be more reliable.

FIG. 2a is a cross-sectional diagram of a semiconductor device package 200a, according to the present invention, similar to FIG. 1b except that no dielectric coating of the die 230a is employed. A package body 212 includes a cavity wherein the semiconductor die 230a is mounted to a die attach pad 220a at the bottom of the cavity. Conductive traces 240a and 240b extend into the cavity. A bond wire 250a forms an electrical connection between the die 230a and the one of the conductive traces 240a. Another bond wire 250b forms another electrical connection between the die 230a and another conductive trace 240b. The cavity is filled with sulfur hexafluoride gas 214 at a positive pressure (preferably by assembling the package in a pressurized sulfur hexafluoride environment) and a lid 207 seals the cavity. The lid 207 is secured in place suitable sealant or adhesive 208. The sulfur hexafluoride gas tends to suppress arcs due to electrostatic discharge within the package.

While the technique described with respect to FIG. 2a is suitable for packages for which the lid can be secured using low-temperature techniques, other package types, such as ceramic packages require high-temperature processing which would decompose the sulfur hexafluoride gas, rendering it ineffective. For such packages, the embodiment shown and described below with respect to FIG. 2b can be used.

FIG. 2b shows an alternative cavity-type semiconductor device assembly 200b, identical to that of FIG. 2a in all respects except that a lid 207a with "vent" holes 265a and 265b (similar to the lid 107a of FIG. 1c) is used to cover the cavity. In this case, the lid 207a is assembled to the package prior to filling the cavity with the gas 214. The cavity is filled with the 214 through one of the "vent" holes 265a or 265b. As the gas 214 fills the cavity, any pre-existing gaseous environment therein is displaced. If two holes (e.g., 165a,b) are used, the second hole may be used as an escape vent for the gas in the cavity. When enough sulfur hexafluoride has been pumped into the cavity via the first hole (e.g., 265a), the second hole (e.g., 265b) is plugged with a suitable plug or sealant glob 270b. Enough sulfur hexafluoride gas is introduced into the cavity through the first hole (e.g. 265a) to ensure a positive pressure. The first hole (e.g., 265a) is then sealed with a suitable plug or sealant glob (e.g., 270a). Alternatively, the package (with lid 207a assembled) can be placed in an evacuated environment (vacuum) and sulfur hexafluoride gas can be introduced into the evacuated environment until a suitable pressure is reached, at which point the hole(s) (265a, 265b) are sealed.

It will be readily understood by one of ordinary skill in the art that the "M-Quad" package is ideally suited to this technique, since it has a substantial cavity and a small hole in one of the lids to facilitate filling the package with either a liquid or a gas.

The techniques of the present invention are directed to filling the cavities of semiconductor device assemblies with a fluid (either a gas or a liquid) to remove heat from a die and to suppress arcing within the cavity. Various materials (for filling the cavity) are set forth. These materials may be used in combination with one another to achieve multiple goals. It has also been described that the die, connections to the leads, and portions of the leads exposed within the cavity can be coated to prevent corrosion and/or electrical shorting of the die, connections and leads. When such a coating is employed, the choice of cavity-filling materials is evidently broadened to include those materials which would otherwise corrode or short out the various elements within the cavity. When such a coating is not employed, the choice of materials is somewhat attenuated.

What is claimed is:

1. A method of making a semiconductor device assembly, comprising the steps of:
    providing a semiconductor device package with a die-receiving cavity;
    disposing a semiconductor die within the cavity;
    coating the semiconductor die with an inorganic dielectric material to prevent carbon tracking from electrostatic discharge and contamination of the die from chemical reaction;
    filling the cavity with a thermally conductive fluid; and
    sealing the cavity with a lid.

2. The method according to claim 1, further comprising the steps of:
    providing conductive leads extending into the cavity;
    forming electrical connections between the semiconductor die and the conductive leads; and
    disposing an inorganic dielectric coating over exposed portions of the conductive leads in the cavity and the electrical connections.

3. The method according to claim 1, further comprising the steps of:
    providing at lest one hole in the lid;
    filling the cavity with the thermally conductive fluid through the at least one hole; and
    subsequently sealing the at least one hole with at least one plug.

4. The method according to claim 1, wherein: the inorganic dielectric coating: is silicon dioxide.

5. The method according to claim 1, wherein: the thermally conductive fluid is a fluorocarbon.

6. The method according to claim 1, wherein: the thermally conductive fluid is a thermally conductive liquid.

7. The method according to claim 1, wherein: the thermally conductive fluid is helium.

8. The method according to claim 1, wherein: the thermally conductive fluid is hydrogen.

9. The method according to claim 1, wherein: the thermally conductive fluid is silicate "gel".

10. A method of making a semiconductor device assembly, comprising the steps of:
    providing a semiconductor device package with a die-receiving cavity;
    disposing a semiconductor die within the cavity;
    pressurizing the cavity with sulfur hexafluoride gas to substantially reduce electrostatic discharge; and
    sealing the cavity and the sulfur hexafluoride gas therein with a lid.

11. The method according to claim 10, further comprising the steps of:
    providing at least one hole in the lid, through which the sulfur hexafluoride gas is introduced into the cavity; and
    sealing the at least one hole with at least one plug.

* * * * *